United States Patent [19]
Ohkubo

[11] Patent Number: 6,160,298
[45] Date of Patent: Dec. 12, 2000

[54] FULL CMOS SRAM CELL COMPRISING VCC AND VSS BUSES ON BOTH SIDES OF EACH OF COMPLEMENTARY DATA LINES ON A SINGLE LEVEL

[75] Inventor: Hiroaki Ohkubo, Tokyo, Japan

[73] Assignee: NEC Corporation, Tokyo, Japan

[21] Appl. No.: 08/893,780

[22] Filed: Jul. 11, 1997

[30] Foreign Application Priority Data

Jul. 15, 1996 [JP] Japan ................................. 8-184831

[51] Int. Cl.$^7$ ............................. H01L 29/76; H01L 27/11
[52] U.S. Cl. ............................................ 257/393; 257/903
[58] Field of Search .................................. 257/393, 369, 257/207, 903, 904

[56] References Cited

U.S. PATENT DOCUMENTS

| | | | |
|---|---|---|---|
| 4,481,524 | 11/1984 | Tsujide | 257/903 |
| 5,083,178 | 1/1992 | Otsu | 257/903 |
| 5,818,089 | 10/1998 | Kokubo et al. | 257/903 |

FOREIGN PATENT DOCUMENTS

| | | | |
|---|---|---|---|
| 7-130880 | 5/1995 | Japan | 257/903 |

OTHER PUBLICATIONS

Uehara et al, "A Novel Local Interconnect Technology (MSD) for High–Performance Logic LSIs with Embedded SRAM", IEEE, 1996, p. 142–3.

Ueshima et al, A 5–$\mu m^2$ Full–CMOS Cell for High–Speed SRAMs Utilizing a Optical–Proximity–Effect Correction (OPC) Technology, IEEE, 1996, p. 146–7.

1996 Symposium on VLSI Technology, Digest of Technical Papers, IEEE, 1996, p. ix.

Sekiyama et al, "A 1–V Operating 256–kb Full–CMOS SRAM", IEEE Journal of Solid–State Circuits, vol. 27, No. 5, May 1992, p. 776–782.

*Primary Examiner*—Steven H. Loke
*Attorney, Agent, or Firm*—Foley & Lardner

[57] ABSTRACT

According to a novel pattern layout of a full CMOS SRAM cell comprising first and second transfer, driver, and load transistors, six in total, the driver and load transistors are parallel to a buried word line. The first transfer transistor and the first driver transistor are alongside and parallel to one complementary data line and the second transfer transistor and the second driver transistor are alongside and parallel to the other complementary data line. Moreover, a power bus and a reference bus are parallel to and on both sides of each of the complementary data lines. Preferably, four gate electrodes of the first and second driver and load transistors are individually formed while the word line is used gate electrodes of the first and second transfer transistors.

19 Claims, 12 Drawing Sheets

FULL CMOS SRAM CELL COMPRISING VCC AND VSS BUSES ON BOTH SIDES OF EACH OF COMPLEMENTARY DATA LINES ON A SINGLE LEVEL

BACKGROUND OF THE INVENTION

This invention relates to a six-transistor or full CMOS (complementary metal-oxide-semiconductor) SRAM (static random access memory) cell.

In the manner which will later be exemplified in greater detail, various CMOS SRAM cells are already known and are used in full CMOS SRAM's. A general CMOS SRAM comprises a plurality of word lines and a plurality of pairs of complementary data or bit lines. For example, a 256-kb CMOS SRAM comprises thirty-two word lines and eight pairs of complementary data lines, or eight data line pairs. In a full CMOS SRAM, a great number of full CMOS SRAM cells are arranged in a matrix fashion and are connected to the word lines and to the data line pairs. Each full CMOS SRAM cell comprises two driver transistors, two load transistors, and two transfer or selector transistors. In each of such memory or storage cells, gate electrodes of the transfer transistors are used as one of the word lines. One ends of source and drain terminals of the transfer transistors are connected to complementary data lines of each pair, respectively.

In the full CMOS SRAM cell, other ends of the source and drain terminals are connected to first and second nodes. First and second inverters are composed of the driver and the load transistors. Gate electrodes of the driver and the load transistors of the first inverter are connected to the second node. Likewise, gate electrodes of the second inverter are connected to the first node. Source electrodes of the load transistors are connected to a power or Vcc bus. Source electrodes of the driver transistors are connected to a reference or ground or Vss bus. Drain electrodes of the driver and the load transistors of the first inverter are connected to each other at the first node. Similarly, drain electrodes are connected in the second inverter to each other at the second node.

A full CMOS SRAM cell is described in a paper which is contributed by Akinori Sekiyama and five others to the IEEE Journal of Solid-state Circuits, Volume 27, No. 5, May 1992, pages 776 to 782, under the title of "A 1-V Operating 256-kb Full-CMOS SRAM". Another full CMOS SRAM cell is disclosed in Japanese Patent Prepublication (A) No. 130,880 of 1995. Other full CMOS SRAM's are proposed in the 1996 Symposium on VLSI Technology held Jun. 11 to 13, 1996, jointly by the IEEE Electron Devices Society and the Japan Society of Applied Physics. For example, a Novel Local Interconnect Technology (MSD) for High-Performance Logic LSIs with Embedded SRAM was presented by T. Uehara and twelve others as Paper No. 15.1. A 5-$\mu m^2$ Full-CMOS Cell for High-Speed SRAMs Utilizing a [sic] Optical-Proximity-Effect Correction (OPC) Technology was presented by Masahiro Ueshima and eight others as Paper No. 15.3.

Such conventional full CMOS SRAM cells have a common equivalent circuit. Between these memory cells, differences reside in their layout patterns. According to conventional layout patterns, each memory cell is long along each of the complementary data line pair. More specifically, three transistors are arranged in each memory cell along each data line. As a consequence, each data line has a large parasitic capacitance. This makes it difficult to raise the speed of accessing each memory cell.

In addition, the complementary data lines of each pair are disposed parallel and adjacent to each other. When the memory cell is manufactured according to a fine design rule and put in operation with a low voltage, capacitive coupling becomes serious in the complementary data lines of each pair. As a result of noise between these complementary data line pair, operation of the CMOS SRAM becomes unstable.

Moreover, the power buses cross the complementary data lines and the reference buses in the CMOS SRAM of the Sekiyama et al paper. As for the Japanese patent prepublication, one of the complementary data lines of each pair or in the memory cells arranged along this data line and one of the complementary data lines of an adjacent pair or in adjacent memory cells aligned along this latter data line are disposed parallel and adjacent to each other to make it more difficult to avoid the capacitive coupling. In addition, the power buses are buried or embedded although the complementary data lines and the reference buses are on a single level. Moreover, a plurality of intracell connections are used on a different level in connecting the reference buses to the driver transistors.

SUMMARY OF THE INVENTION

It is consequently an object of the present invention to provide a full CMOS SRAM cell operable at a high speed and with a low voltage.

It is another object of this invention to provide a full CMOS SRAM cell which is of the type described and provides a full CMOS SRAM accessible at a high speed.

It is still another object of this invention to provide a full CMOS SRAM cell which is of the type described and is stably operable.

It is yet another object of this invention to provide a full CMOS SRAM cell which is of the type described and provides a full CMOS SRAM having a reduced parasitic coupling between complementary data lines of each pair.

It is a further object of this invention to provide a full CMOS SRAM cell which is of the type described and provides a full CMOS SRAM having a reduced parasitic coupling between the complementary data lines of each pair and similar data lines of an adjacent pair.

It is a still another object of this invention to provide a full CMOS SRAM cell which is of the type described and provides a full CMOS SRAM having a reduced capacitive coupling between the data lines in each cell and in adjacent cells.

It is a yet further object of this invention to provide a full CMOS SRAM cell which is of the type described and provides a full CMOS SRAM comprising a power bus and a reference bus on both sides of each of complementary data lines on a single level.

In accordance with this invention, there is provided a CMOS SRAM cell comprising first and second driver transistors, first and second load transistors, and first and second transfer transistors with gate electrodes of the first and the second transfer transistors connected to a word line and with one ends of source drain terminals of the first and the second transfer transistors connected to first and second data lines crossing the word line, respectively, wherein the first and the second driver transistors and the first and the second load transistors are arranged along the word lie with the transistors of the CMOS SRAM cell arranged at most two in number along each of the first and the second data lines.

DESCRIPTION OF PREFERRED EMBODIMENTS

Figure 1:
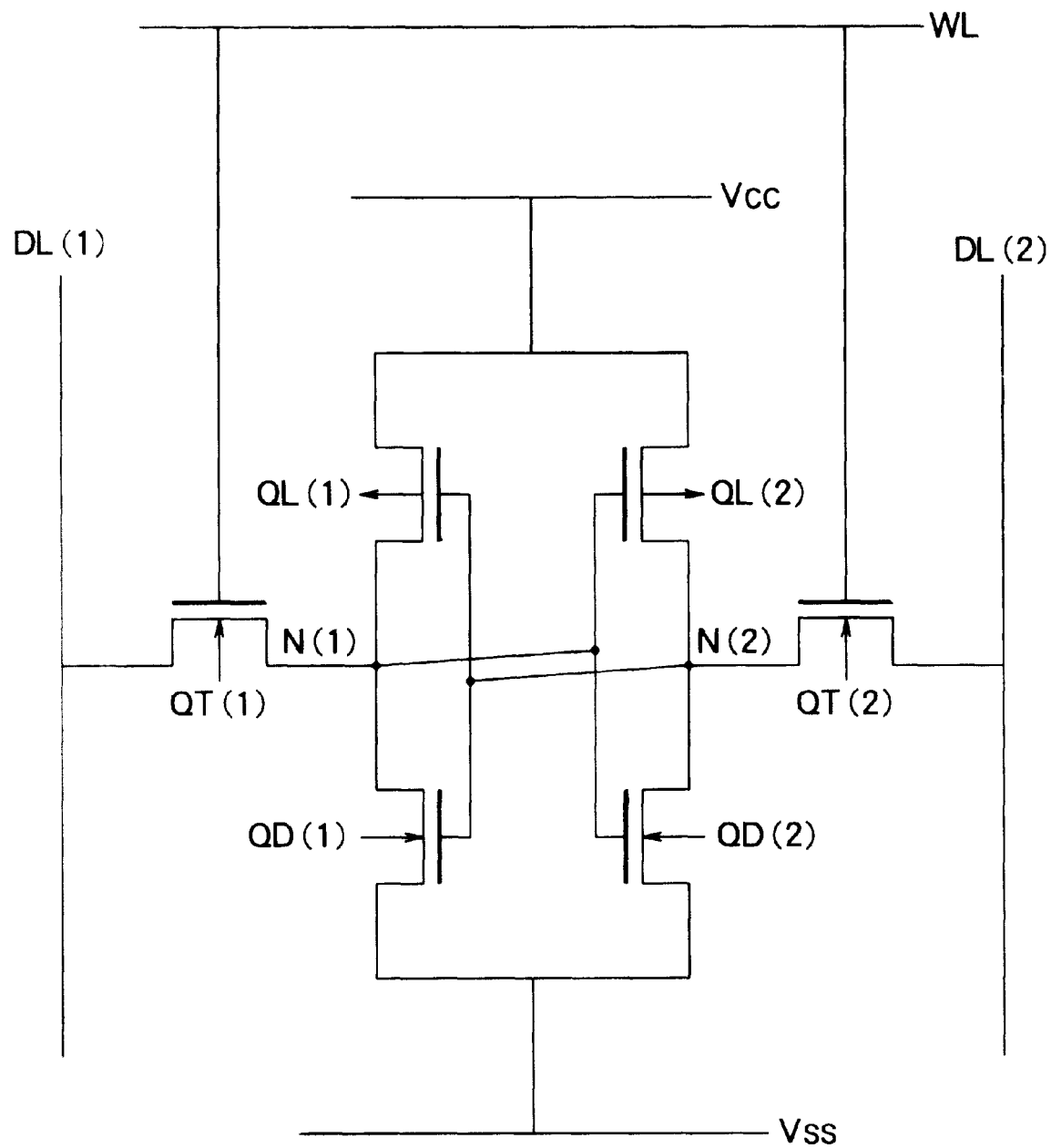
FIG. 1 shows an equivalent circuit of a full CMOS SRAM cell in general.

Referring to FIG. 1, the description will begin at an equivalent circuit of a memory cell of a full CMOS (complementary metal-oxide-semiconductor) SRAM (static random access memory) in general. Preferred embodiments of the present invention will later be described.

The memory cell is placed at a cross point of a complementary data line pair of first and second data lines DL(1) and DL(2) and a word line WL. First and second transfer transistors QT(1) and QT(2) are used to connect the memory cell to the word line WL.

First and second driver transistors QD(1) and QD(2) have their source regions connected to a reference bus Vss. First and second load transistors QL(1) and QL(2) have their source regions connected to a power bus Vcc. In the following, suffixes (1) and (2) will often be omitted merely for brevity of reference symbols.

The transfer and the driver transistors may be n-channel MOSFETS. In this event, the load transistors are p-channel MOSFETs. The first driver and load transistors QD(1) and QL(1) have their drain regions connected to each other at a first node N(1) to form a first inverter. Similarly, the second driver and load transistors QD(2) and QL(2) have drain regions connected together at a second node N(2) to form a second inverter. The first and the second nodes N are connected to gate electrodes of the second and the first inverters, respectively, namely, to the gate electrodes of the second driver and load transistors QD(2) and QL(2) and of the first driver and load transistors QD(1) and QL(1), respectively. In this manner, the first and the second inverters form a flip-flop circuit.

The first and the second transfer transistors QT have their gate electrodes used as the word line WL and their source and drain terminals which in turn have one ends and opposite ends. With the one ends connected to the first and the second data lines DL and with the opposite ends connected to the first and the second nodes N, the transfer transistors QT selectively activates the flip-flop circuit. In this manner, the memory cell is selectively loaded with a write-in datum as a stored datum by cooperation of the word line WL and the data line pair and is read to produce the stored datum as a read-out datum.

Like full CMOS SRAM cells are arranged in a matrix fashion along a plurality of word lines and a plurality of data line pairs to form a full CMOS SRAM. The memory cell comprises cell components, such as a part Vcc of power buses and the driver transistors according to a predetermined layout pattern. The memory cell is manufactured on a semiconductor substrate. It is possible to understand that the layout pattern comprises a diffusion region level, a gate electrode level, a first insulator level, a first conductor level, a second insulator level, and a second conductor level. The cell components of the full CMOS SRAM are formed on a semiconductor substrate which will later be depicted.

Figure 2:
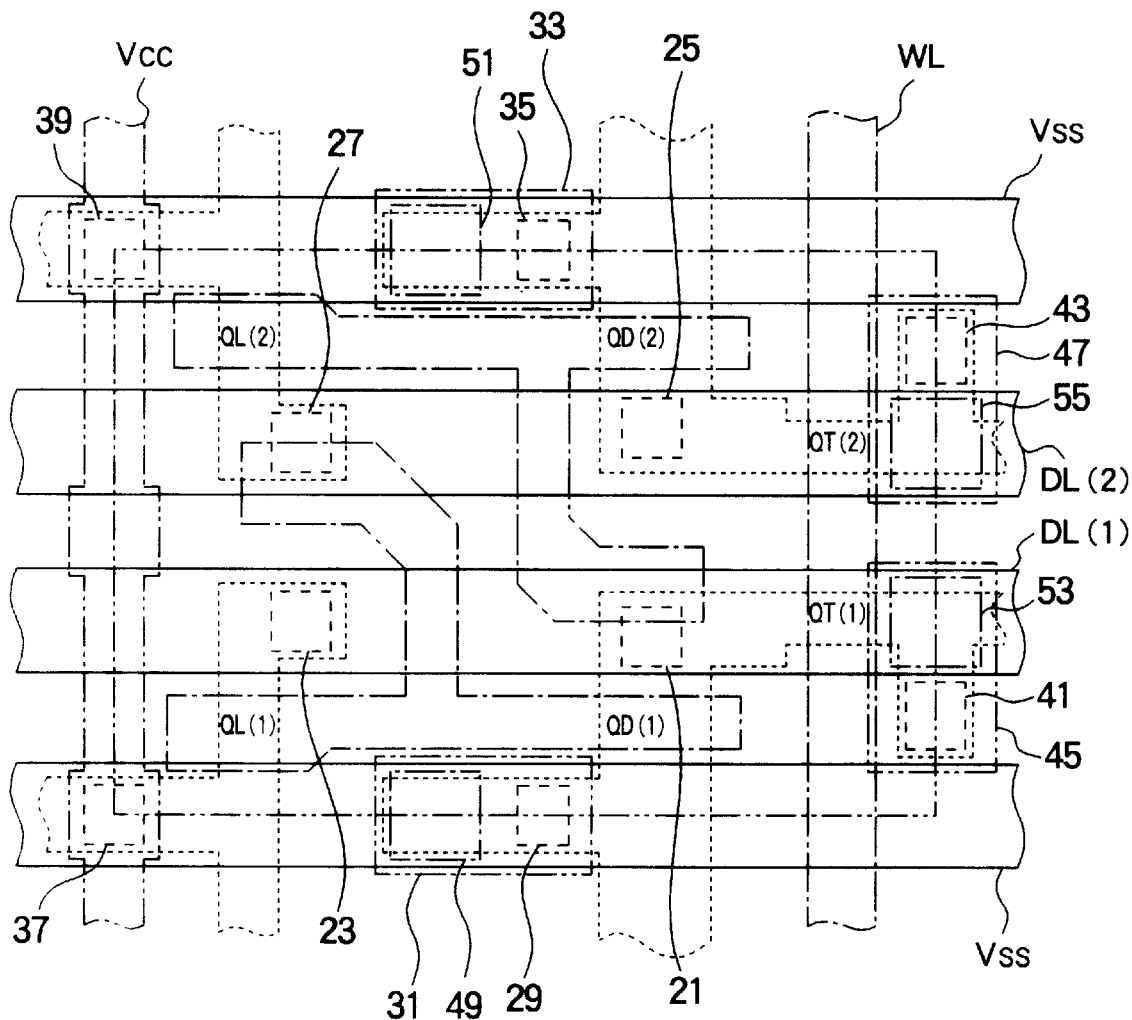
FIG. 2 is a schematic top view of a layout pattern of a conventional full CMOS SRAM cell.

Turning to FIG. 2 with FIG. 1 again referred to, one of the conventional CMOS SRAM cells comprises an n-type semiconductor substrate according to the Sekiyama et al paper referred to hereinabove. The layout pattern of the cell components of the memory cell is as follows. A plurality of activated regions are selectively manufactured on the diffusion region level in the manner illustrated by dotted lines. Polysilicon films are selectively formed on the gate electrode level as illustrated by dash-dot lines. Primary contact holes are formed through a first insulator layer of the first insulator level in the manner depicted as small rectangles by other dash-dot lines. First-level aluminum films are manufactured on a first conductor level as depicted by dash and two-dot lines. Secondary contact holes are formed through a second insulator layer of the second insulator level as depicted by small rectangles of other dash and two-dot lines. Second-level aluminium films are laid on the second conductor level as depicted by solid lines and are exposed outwardly of the CMOS SRAM. Each memory cell occupies a cell area depicted as a wide rectangle of dash and two-dot lines.

In FIG. 2, the power bus Vcc is illustrated near a left-hand margin along a left side of the cell area and is shared by another memory cell which is leftwardly contiguous to the memory cell being illustrated. The word line WL is depicted near to a right side of the cell area and serves as the gate electrodes of the first and the second transfer transistors QT(1) and QT(2). An inverted and an upright generally L-shaped area has horizontal legs crossing the word line WL to extend beyond the cell area right side into a rightwardly contiguous cell area and vertical legs parallel to the word line WL to extend beyond bottom and top sides of the cell area into bottomwise and topwise contiguous cell areas. Each generally L shaped area has a vertical branch along the cell area right side in common to a mirror image L-shaped area of the rightwardly contiguous cell area and a horizontal branch along the cell area bottom or top side in common to another mirror image L-shaped area of the bottomwise or the topwise contiguous cell area. The generally L-shaped areas are n-type activated regions. The horizontal legs provide on both sides of the word line WL the source and drain regions of the transfer transistors QT. The vertical legs provide at corner areas of the generally L-shaped areas and on the bottom and the top sides of the cell area the drain and the source regions of the first and the second drive transistors QD(1) and QD(2).

In an inverted and an upright generally τ-shaped area conductive patterns are formed. The conductive patterns have horizontal legs having in turn right-hand ends crossing the vertical legs of the generally L-shaped areas to serve as the gate electrodes of the drive transistors. Left-hand ends of these horizontal legs serve as the gate electrodes of the first and the second load transistors QL(1) and QL(2). Beneath the left-hand ends, bottom and top generally T-shaped areas are formed as p-type activated regions and comprise vertical legs having ends to serve as the drain electrodes of the load transistors QL and other ends in the bottomwise and the topwise contiguous cell areas. The T-shaped areas have horizontal legs which extend beyond the cell area left-hand side to complete generally H-shaped areas in cooperation with mirror-shaped areas of the leftwardly contiguous cell area and to provide junction areas which are in contact with the horizontal legs and serve as the source regions of the load transistors QL.

At the corner area of the inverted generally L-shaped area, a first primary contact hole 21 is formed through the first insulator layer. At the top end of the vertical leg of the bottom generally T-shaped area, a second primary contact hole 23 is formed through the first insulator layer. On the first insulator layer, a first intracell connection (not shown) by an aluminum film of the first conductor level is manufactured to interconnect the drain regions of the first driver and load transistors QD(1) and QL(1) and a bottom right-hand end of the upright generally τ-shaped area and to serve as the first node N(1). Similarly, a second intracell connector (not shown) is formed to interconnect the drain regions of the second driver and load transistors QD(2) and QL(2) and a top left-hand end of the inverted generally τ-shaped area and to serve as the second node N(2) through third and fourth primary contact holes 25 and 27.

At the horizontal branch of the inverted generally L-shaped area near the vertical leg, a fifth primary contact hole 29 is formed with a first pad 31 of an aluminium film brought into contact with the source region of the first driver transistor QD(1) through this contact hole 29 for the purpose which will presently be described. Likewise, a second pad 33 is brought into contact with the source region of the second driver transistor QD(2) through a sixth primary contact hole 35.

At a bottom left corner of the cell area, a seventh primary contact hole 37 is formed. At a top left corner of the cell area, an eighth primary contact hole 39 is formed. Through those contact holes 37 and 39, the power bus Vcc is manufactured in contact with the source regions of the first and the second load transistors QL by selectively depositing an aluminium film on the first insulator layer. The power bus extends along the left-hand side of the cell area for use also by the leftwardly contiguous memory cell. At ends of the vertical branches of the inverted and the upright generally L-shaped areas, ninth and tenth primary contact holes 41 and 43 are formed, through which third and fourth pads 45 and 47 are brought into contact with ends of the source and drain regions of the first and the second transfer transistors QT by depositing aluminium films on the first insulator layer for the purpose which will shortly become clear.

Near left ends of the horizontal branches of the inverted and the upright generally L-shaped areas, first and second secondary contact holes 49 and 51 are formed through the second insulator layer. For use as bottom and top reference buses which are for common use by bottomwise and topwise contiguous memory cells and are therefore indicated by the reference symbol Vss in common, aluminium films are selectively deposited on the second insulator layer and brought into contact with the first and the second pads 31 and 33 through the first and the second secondary contact holes 49 and 51 and consequently with the source regions of the first and the second drive transistors QD, respectively. At right ends of the horizontal legs of the inverted and the upright generally L-shaped areas, third and fourth secondary contact holes 53 and 55 are formed, through which brought into contact with the third and the fourth pads 45 and 47 and therefore with the source and drain regions of the first and the second transfer transistors QT are the first and the second data lines DL(1) and DL(2) made of aluminium films selectively deposited on the second insulator layer.

It is now understood as illustrated with reference to FIGS. 1 and 2 in connection with the Sekiyama et al paper that the first or the second driver, load, and transfer transistors QD, QL, and QT are arranged serially in each memory cell along the data line DL and that the complementary data lines DL of each pair are adjacent to each other. It is noted in addition that their full CMOS SRAM comprises the word lines and the power buses, such as WL and Vcc, which inevitably cross the reference buses, such as Vss, and the data lines DL.

Figure 3:
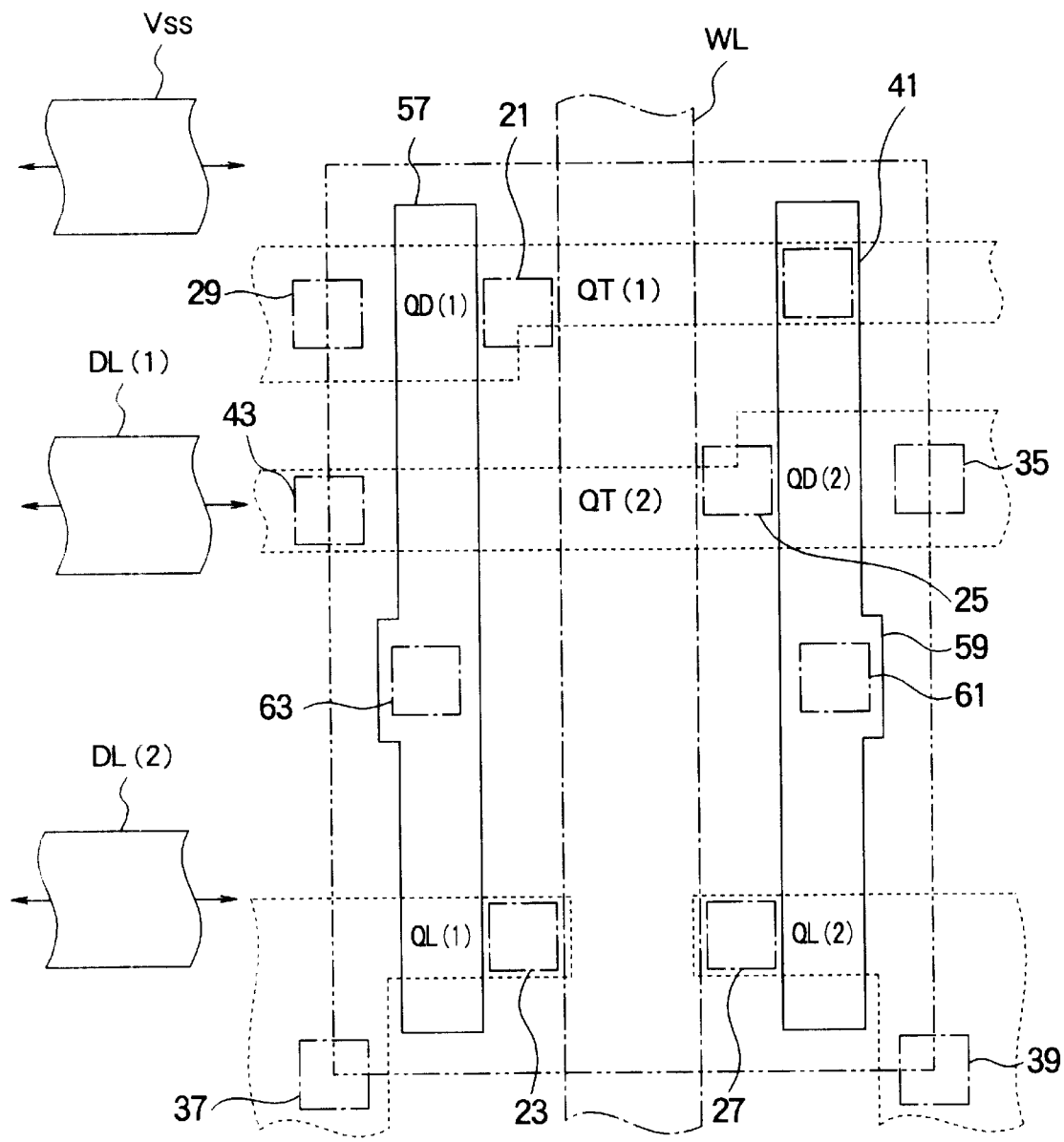
FIG. 3 is a schematic top view of a layout pattern of another conventional full CMOS SRAM cell.

Further turning to FIG. 3 with FIG. 1 continuously referred to, another of the conventional CMOS SRAM cells comprises a p-type semiconductor substrate according to the Japanese patent prepublication referenced heretobefore. Using another layout pattern depicted in FIG. 3 where similar parts are designated by like reference symbols and numerals, this memory cell is manufactured according to manufacturing steps which are like those used in the Sekiyama et al memory cell. The cell area is indicated by a wide rectangle of dash and two-dot lines.

Near to the top side of the cell area, first and second n-activated regions are selectively formed parallel on the semiconductor substrate. Later in the manufacturing steps, the word line WL is formed on the first insulator layer vertically centrally of the cell area for use as the gate electrodes of the first and the second transfer transistors QT. Rightwardly offset in the first n-activated region which is nearer to the top side of the cell area, the source and drain regions of the first transfer transistor QT(1) are present on both sides of the word line WL. Similarly, the source and drain regions of the second transfer transistor QT(2) are present on both sides of the word line WL leftwardly offset in the second n-activated region. At the manufacturing step of the word line WL, a first gate electrode region 57 is formed vertically near the left-hand side of the cell area. A second gate electrode region 59 is formed vertically near to the right-hand side of the cell area. On left-hand and right-hand sides of the first gate electrode region 57 in the first n-activated area, the first driver transistor QD(1) has the source and the drain regions, respectively. On right-hand and left-hand sides in the second n-activated area as regards the second gate electrode region 59, the second driver transistor QD(2) has the source and the drain regions, respectively.

Left and right generally T-shaped p-activated areas are selectively formed on the semiconductor substrate to have horizontal legs parallel near to the bottom side of the cell area and vertical legs along the left and the right sides of the cell area to share the p-activated areas with leftwardly and rightwardly contiguous memory cells. It should be noted that the vertical legs extend bottomwise so that the generally T-shaped p-activated areas are in effect first and second H-shaped areas in six cell areas which include the illustrated cell area as an upper middle cell area. The first and the second gate electrode regions are used as the gate electrodes of the first and the second load transistors QL. On left and right sides of the first gate electrode region 55 in the horizontal leg of the left generally T-shaped p-activated area, the first load transistor QL(1) has the source and the drain regions, respectively. On right and left sides of the second gate electrode region in the right generally T-shaped p-activated area, the second load transistor QL(2) has the source and the drain regions. The source region of the first load transistor QL(1) is for common use by four memory cells which include the illustrated memory cell at an upper right-hand corner. Likewise, the source region of the second load transistor QL(2) is commonly used in four different memory cells which include the illustrated memory cell at an upper left-hand corner.

So as to reach the first n-activated region, the first primary contact hole 21 and the second primary contact hole 23 are formed in the first insulator layer, through which holes the first intracell connection of a substantially rectangular shape (not shown) is formed to connect the drain regions of the first driver and load transistors QD(1) and QL(1) to the second gate electrode region 57 through an eleventh primary contact hole 61 and to serve as the first node N(1). Similarly, the third and the fourth primary contact holes 25 and 27 are formed, through which the second intracell connection of a like rectangular shape (not shown) is made to contact the drain regions of the second driver and load transistors QD(2) and QL(2) to the first gate electrode region 55 through a twelfth primary contact hole 63 and to serve as the second node N(2). Incidentally, parts of the first and the fourth primary contact holes 21 and 27 are used in FIG. 2 as the eleventh and the twelfth ones 61 and 63.

So as to reach the first n-type activated area at its end crossing the left side of the cell area, the fifth primary contact hole 29 is formed through the first insulator for contact with the source region of the first driver transistor QD(1) by the first pad which is indicated by the reference numeral 31 in FIG. 2 and is not depicted in FIG. 3. As indicated by the reference numeral 33 in FIG. 2 and not illustrated in FIG. 3, the second reference pad is brought into contact with the drain electrode of the second driver transistor QD(2) through the sixth primary contact hole 35 formed to reach the second n-type activated area at its end crossing the right side of the cell area. The first and the second pads are connected to the reference bus Vss laid on the second insulator layer through the first and the second contact holes which are depicted in FIG. 2 at 49 and 51 and are not depicted in FIG. 3. Through the seventh and the eighth primary contact holes 37 and 39 formed at bottom left and right corners of the cell area, respectively, the power bus Vcc (not shown in FIG. 3) is brought into contact with the source regions of the first and the second load transistors QL, respectively, and is formed on the first insulator layer and beneath the second insulator layer. To reach the first and the second n-type activated areas, the ninth and the tenth primary contact holes 41 and 43 are formed near the right side and on the left side of the cell area to bring into contact, with the source drain regions of the first and the second transfer transistors QT, the third and the fourth pads which are indicated in FIG. 2 at 45 and 47 and are not illustrated in FIG. 3. The third and the fourth pads are for connection to the first and the second data lines DL(1) and DL(2), respectively, through the third and the fourth secondary contact holes which are indicated in FIG. 2 at 53 and 53, respectively, and are not depicted in FIG. 3.

It is now understood in the manner illustrated with reference to FIGS. 1 and 3 as regards the Japanese patent prepublication that the first driver transistor QD(1), the first or the second transfer transistor QT(1) or QT(2), and the second driver transistor QD(2) are arranged sequentially in each memory cell along the first data line DL(1). The second data line DL(2) is close to the first data line DL(1) and to another first data line in a bottomwise adjacent memory cell. The power buses, such as Vcc, are embedded in the full CMOS SRAM. Moreover, a plurality of intracell connections, such as the first through the fourth pads, are complicatedly used in each memory cell.

Referring now to FIGS. 4 and 5 and again to By. FIG. 1, the description will proceed to a full or six-transistor CMOS SRAM cell according to a first preferred embodiment of this invention. Similar parts are designated by like reference symbols and numerals.

During progress of the description, a novel layout pattern will be described by additionally referring to FIGS. 6 to 11 which show parts of the memory cell of FIG. 4 separated into six levels, namely, the diffusion region level, the gate electrode level, the first insulator level, the first conductor level, the second insulator level, and the second conductor level mentioned before in connection with FIG. 1. In FIGS. 6 to 11, the cell area is indicated by a combined reference symbol CA in dash and two-dot lines. It should be noted in this connection that, although such a cell area is not different in practice from a level to another level, the cell area CA is somewhat different from a figure to another figure in FIGS. 6 to 11 merely for convenience of illustration.

Figure 5:
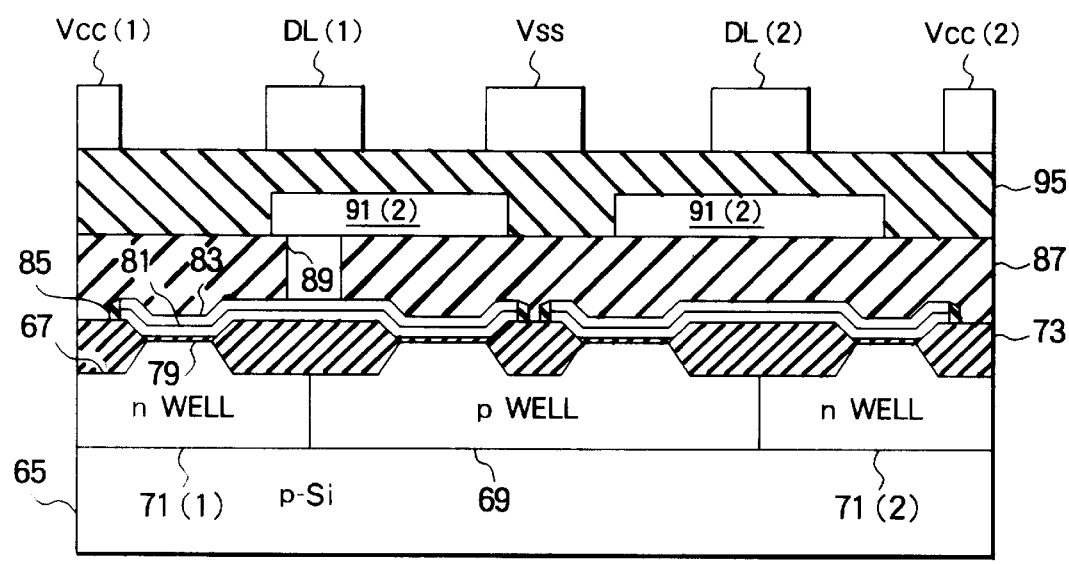
FIG. 5 schematically shows a section taken along a line 5—5 of FIG. 4.
Figure 6:
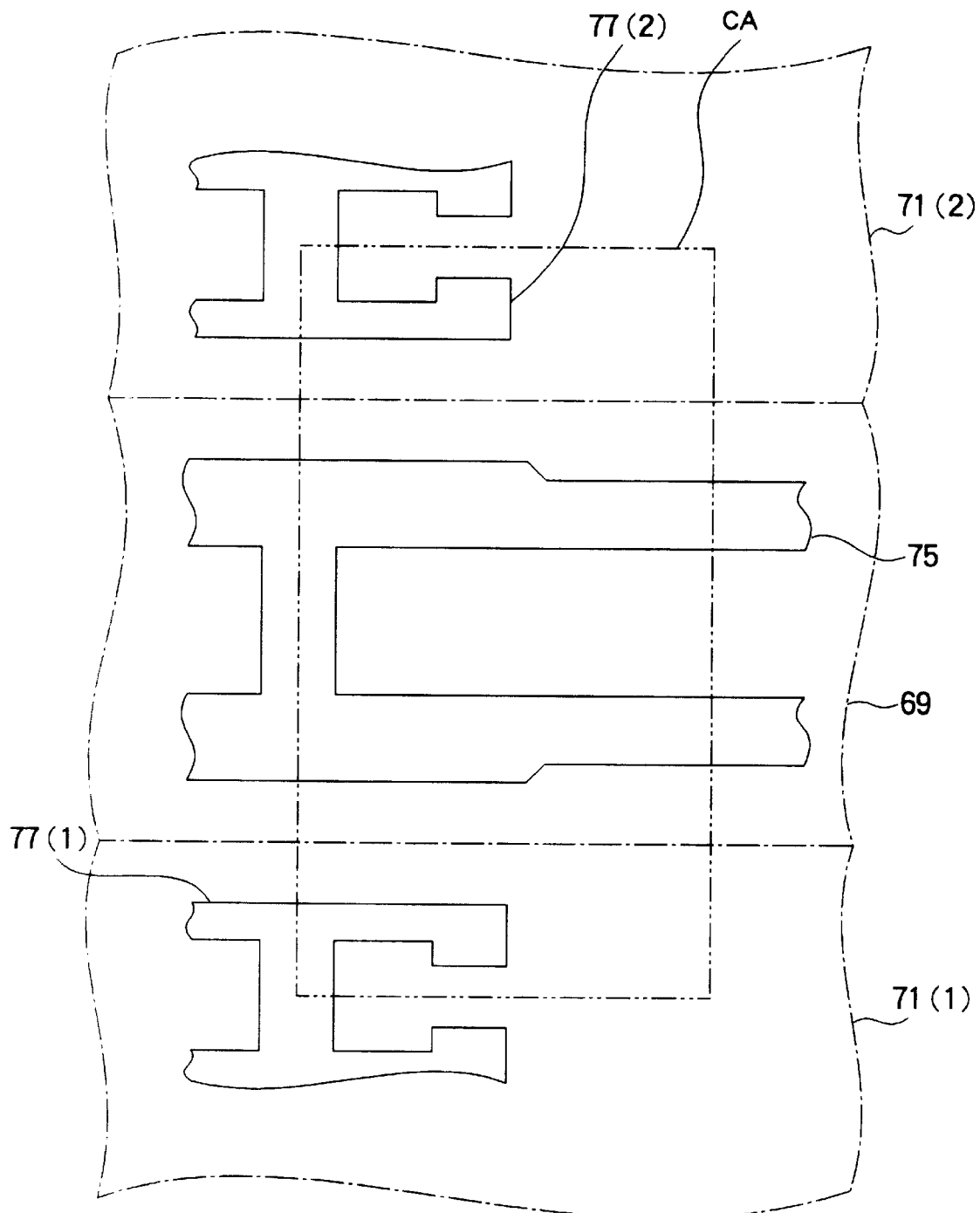
FIGS. 6 to 11 schematically show the layout pattern of FIG. 4 on various levels.
Figure 7:
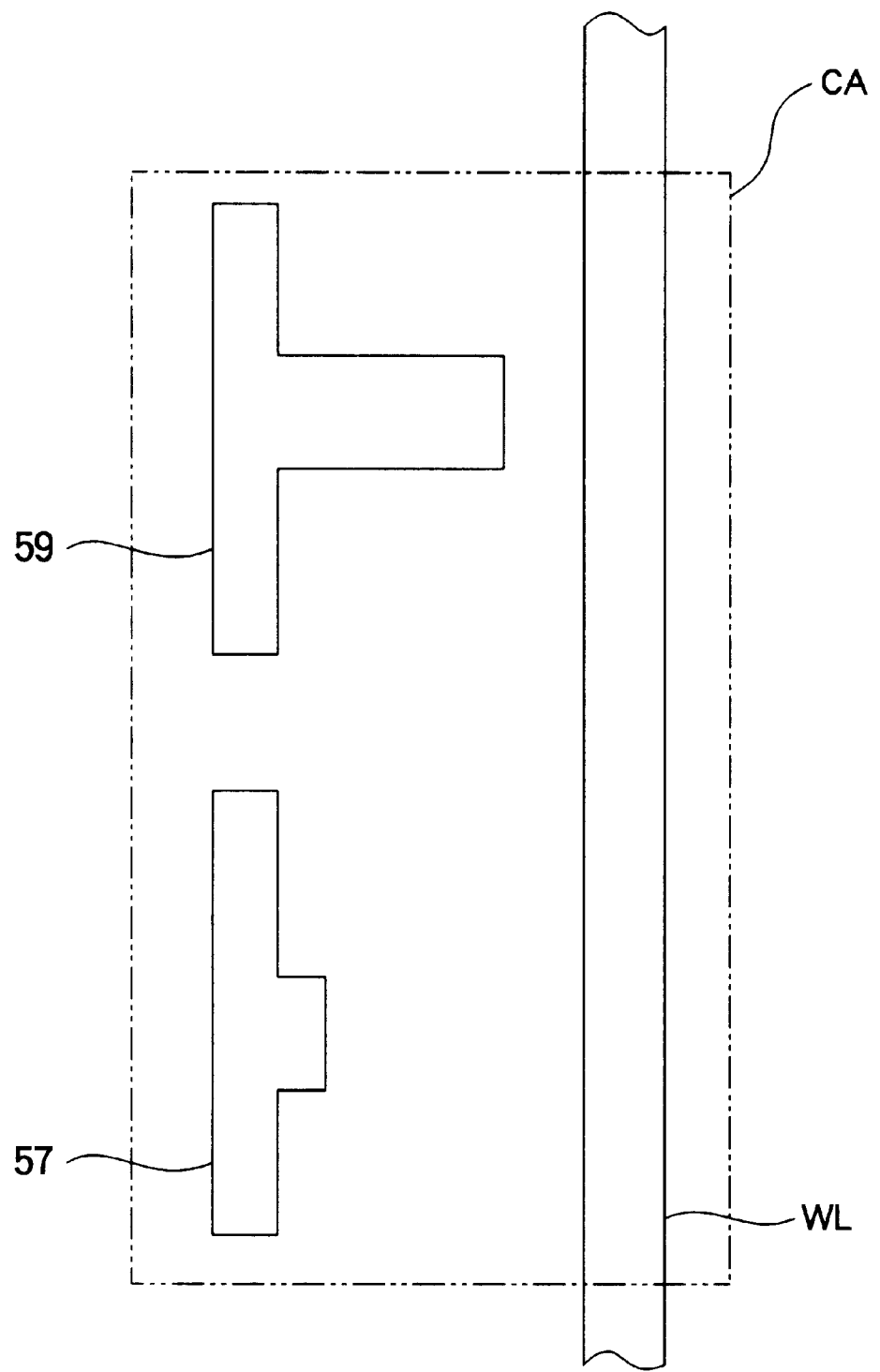

In the manner clear in FIG. 5, the memory cell was manufactured on a p-type silicon substrate 65 having a principal surface at 67. Beneath the principal surface 67, p and n wells were selectively formed. The p well is exemplified at 69. The n well is exemplified as first LICE and second n wells 71(1) and 71(2) and will either collectively or individually indicated by the reference numeral 71. Such wells 69 and 71 were manufactured by injection of boron and phosphorus ions with a dose between 5E10 and 5E13 per square centimeter and either at a moderate energy between 50 and 150 keV followed by heat treatment at about 1200° C. or at a high energy between 300 and 1000 keV. In FIG. 6, the p well 69 and the first and the second n wells 71(1) and 72(2) are depicted as a top view.

Along the principal surface 67, a field oxide layer 73 was formed by selective oxidation to a layer thickness between 3000 and 6000 angstroms for use as an element isolation layer. Areas isolated by the field oxide layer 73 are depicted in FIGS. 4 and 6 as a generally H-shaped wider area 75 and also in generally H-shaped regions as first and second narrower areas 77(1) and 77(2) or 77. It should be noted in FIGS. 4 and 6 that the narrower areas 77(1) and 77(2) have a bottom and a top side which are depicted by curved lines in order merely to indicate that these areas 77 are illustrated with parts omitted. In FIG. 4, the field oxide layer 73 is not depicted.

On the p well and the n wells 69 and 71 and crossing the wider area and the narrower area 75 and 77, a gate oxide film 79 was selectively formed as depicted in FIG. 5 by thermal oxidation to a film thickness between 50 and 200 angstroms. On the gate oxide film 79 and the field oxide layer 73, the word line WL and the first and the second gate electrode regions 57 and 59 of FIG. 3 were selectively formed as shown also in FIG. 7. More particularly, the word line WL and the gate electrodes 55 and 57 comprise in FIG. 5 a polycrystalline silicon film with an n-type impurity 81 and a tungsten silicide (tungsten polycide) film 83 successively depicted on the gate oxide film 79 to a film thickness between 500 and 2000 angstroms and to another film thickness between 1000 and 2000 angstroms, respectively.

Figure 4:
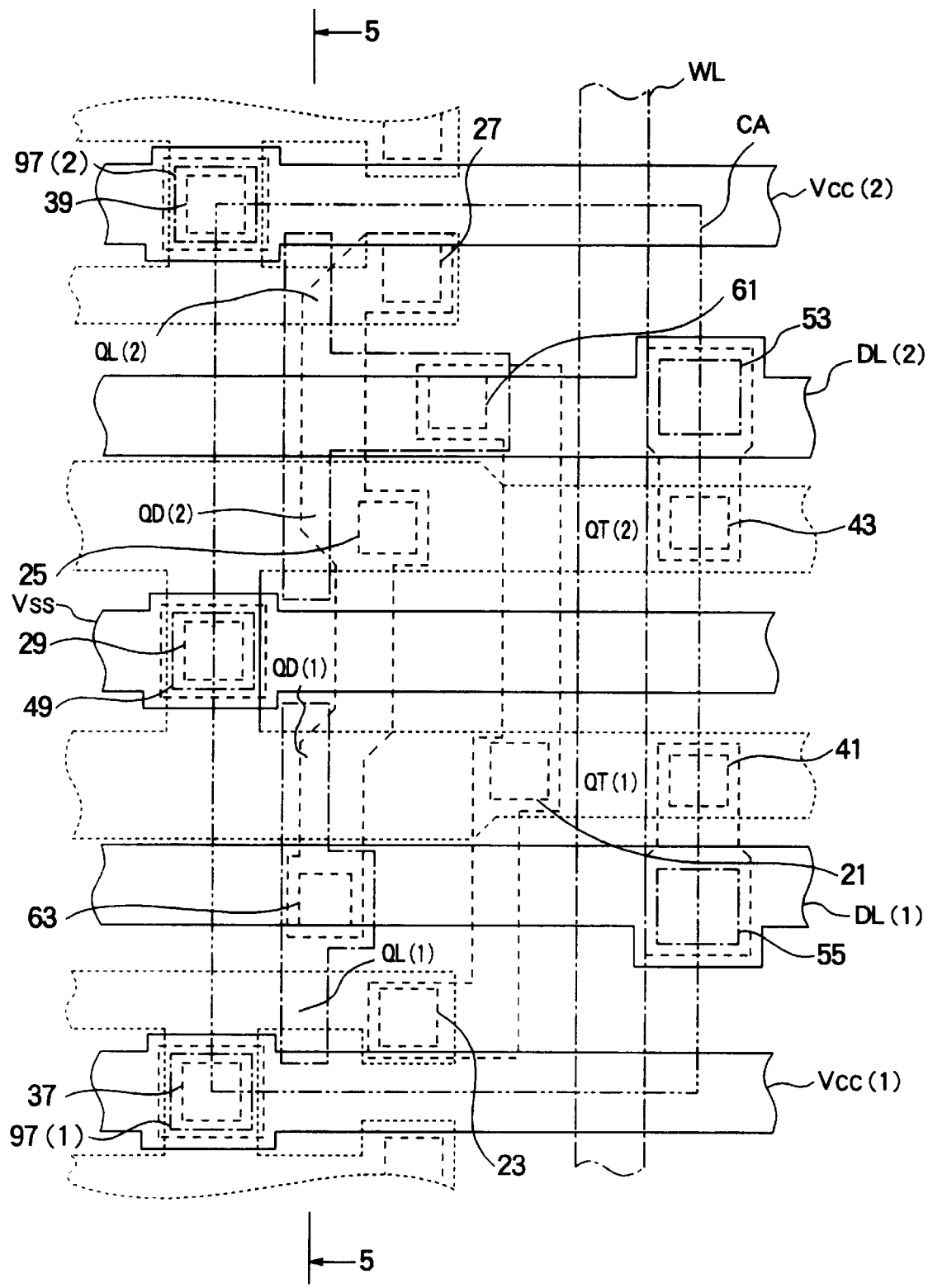
FIG. 4 is a schematic top view of a layout pattern of a full CMOS SRAM cell according to a first embodiment of the instant invention.

In FIGS. 4 and 6, an n-activated region and first and second p-activated regions were formed by injecting arsenic ions and boron ions of a low energy between 20 and 70 keV and with a dose between 1E15 and 1E16 per square centimeter into the p well 69 and the first and the second n wells 71(1) and 71(2) to provide the wider and the first and the second narrower areas 75, 77(1), and 77(2), respectively. The p-activated region 75 serves as the source and drain regions of the first and the second drive transistors QD(1) and QD(2) and of the first and the second transfer transistors QT(1) and QT(2). The first n-activated region 77(1) serves as the source and drain region of the first load transistor QL(1). The second n-activated region 77(2) serves as the source and drain region of the second load transistor QL(2). The word line WL serves as the gate electrodes of the first and the second transfer transistors QT. The first gate electrode 57 serves as the gate electrodes of the first driver and load transistors QD(1) and QL(1). The second gate electrode 59 serves as the gate electrodes of the second driver and load transistors QD(2) and QL(2).

Figure 8:
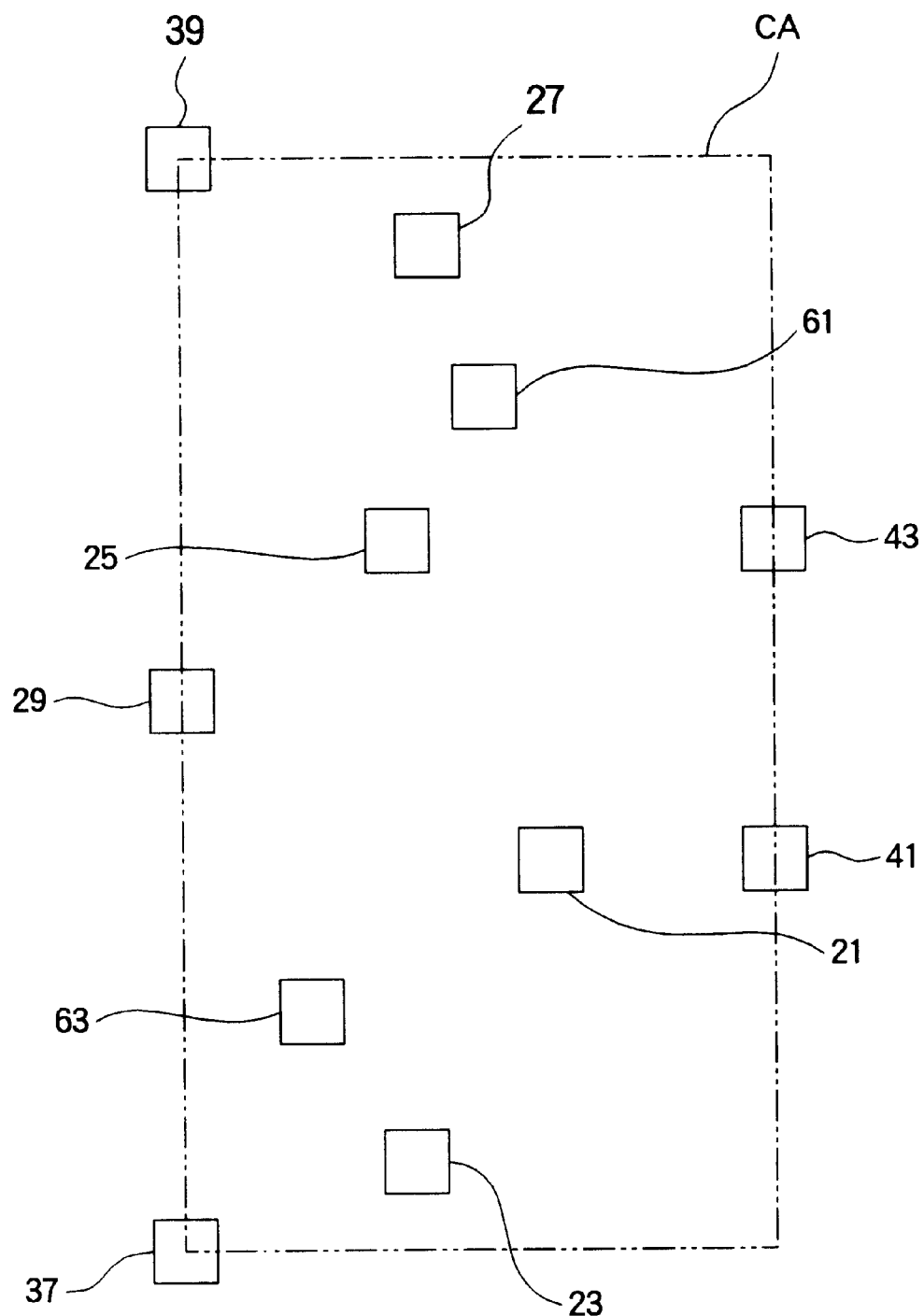

In FIG. 5, the transistors QD, QL, and QT of FIG. 4 were restricted by side walls 85. On the transistors and partially on the field oxide layer 73, a first insulator layer 87 was formed. Through the first insulator layer 87, a plurality of primary contact holes were formed, one being exemplified at 89 at primary predetermined positions to reach either the p-activated region 75 and the n-activated regions 77 or the gate electrodes (81, 83). In FIG. 8, the primary contact holes comprise, like in FIGS. 2 and 3, the first primary contact hole 21, the second primary contact hole 23, the third primary contact hole 25, the fourth primary contact hole 27, the fifth primary contact hole 29, the seventh primary contact hole 37, the eighth primary contact hole 39, the ninth primary contact hole 41, the tenth primary contact hole 43, the eleventh primary contact hole 61, and the twelfth primary contact hole 63. The sixth primary contact hole 35 which is present in FIGS. 2–3 is not shown; in FIGS. 4 and 8 because the fifth one 29 connects both the first and second drive transistors QD(1) and QD(2) to the reference bus Vss. The contact hole 89 of FIG. 5 corresponds to the twelfth primary contact hole 63. Such primary contact holes were filled with tungsten plugs.

Figure 9:
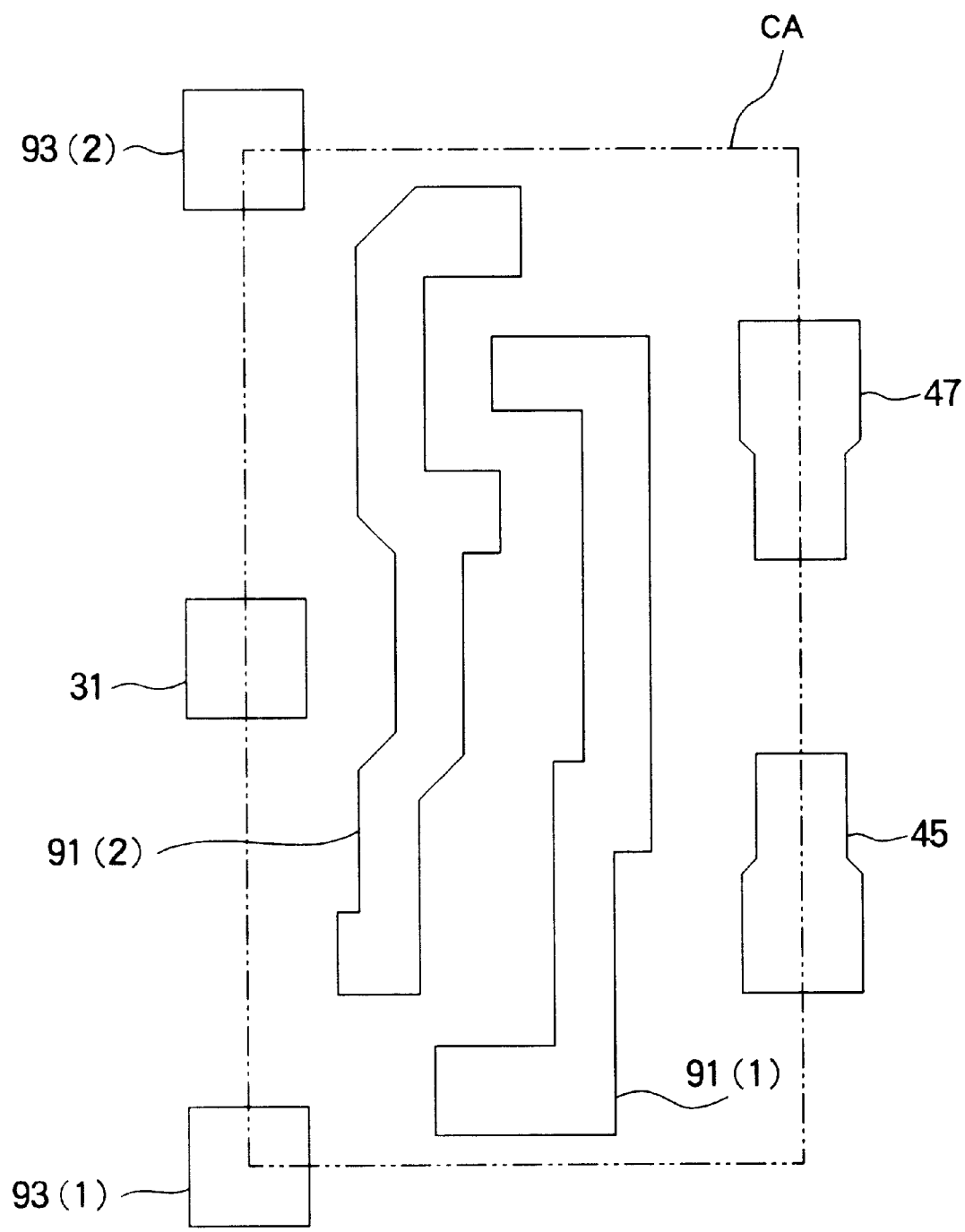

On the first insulator layer 87, a plurality of aluminium films were selectively formed to a film thickness between 3000 and 6000 angstroms and in contact with the tungsten plugs to serve as the first and the second intracell connections mentioned in conjunction with FIG. 2 and indicated in FIG. 9 at 91(1) and in FIGS. 5 and 9 at 91(2) and in FIG. 9 as the first through the fourth pads 31, 33, 45, and 47 of FIG. 2 and as first and second additional pads 93(1) and 93(2) for the contact holes 37 and 39. In FIG. 9, the first pad 31 is used also as the second pad 33. In FIG. 5, the second pad 91(2) is divided into two parts by the first insulator layer 87.

Figure 10:
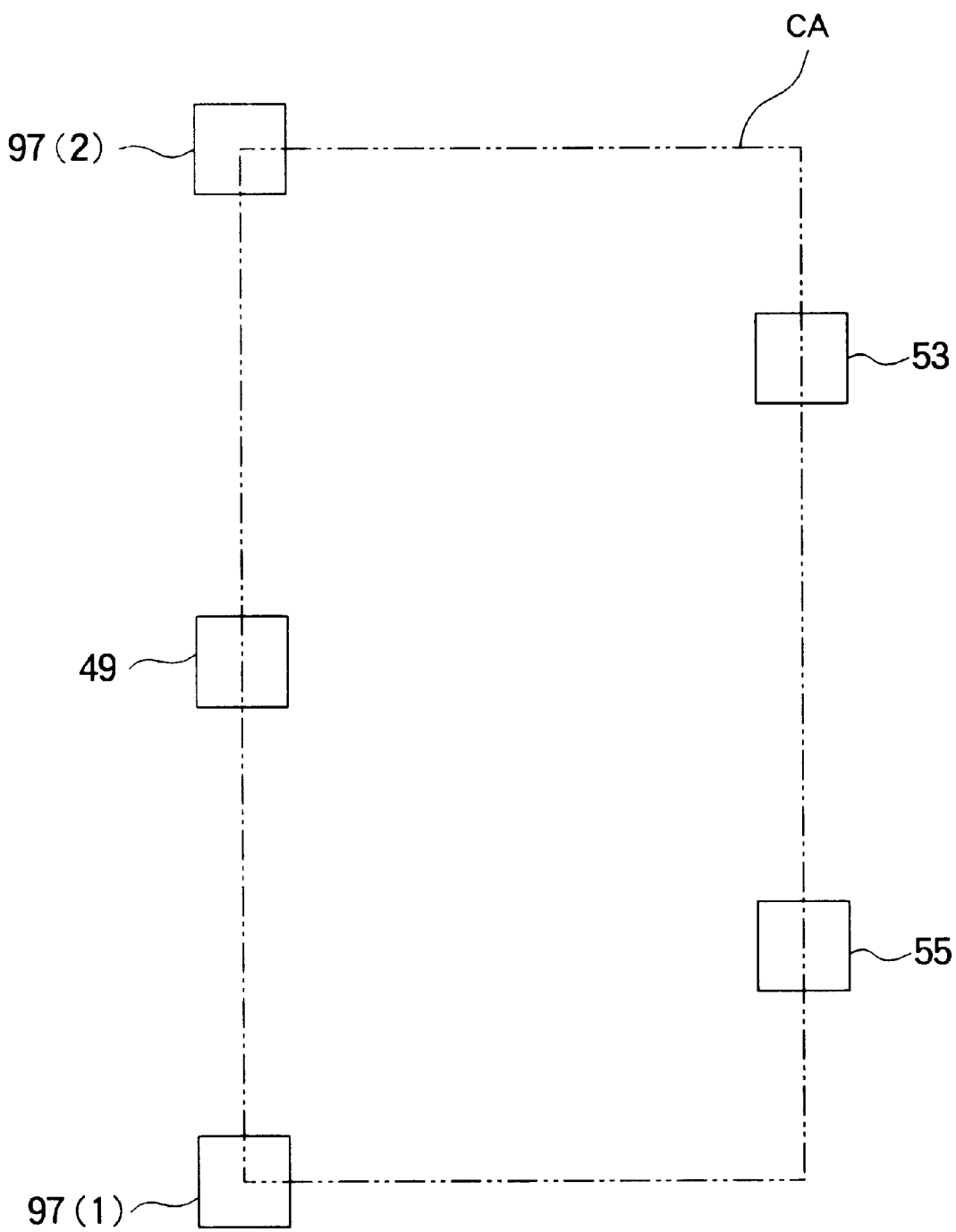

On the aluminum films and the first insulator layer 87 in FIG. 5, a second insulator layer 95 are formed, through which a plurality of secondary contact holes were formed at secondary predetermined positions and were filled with tungsten plugs. In FIG. 10, the secondary contact holes 48, 52, and 55 comprise the first through the fourth secondary contact holes 49, 51, 53, and 55 of FIG. 2 (secondary contact hole 51 is not shown in FIG. 10 because the secondary contact hole 49 occupies the same position) and additionally fifth and sixth secondary contact holes 97(1) and 97(2). In the first or the second and the third through the sixth secondary contact holes, the tungsten plugs are brought into contact with the first or the second pad 31, the third pad 45, the fourth pad 47, and the first and the second additional pads 91(1) and 91(2), respectively.

Figure 11:
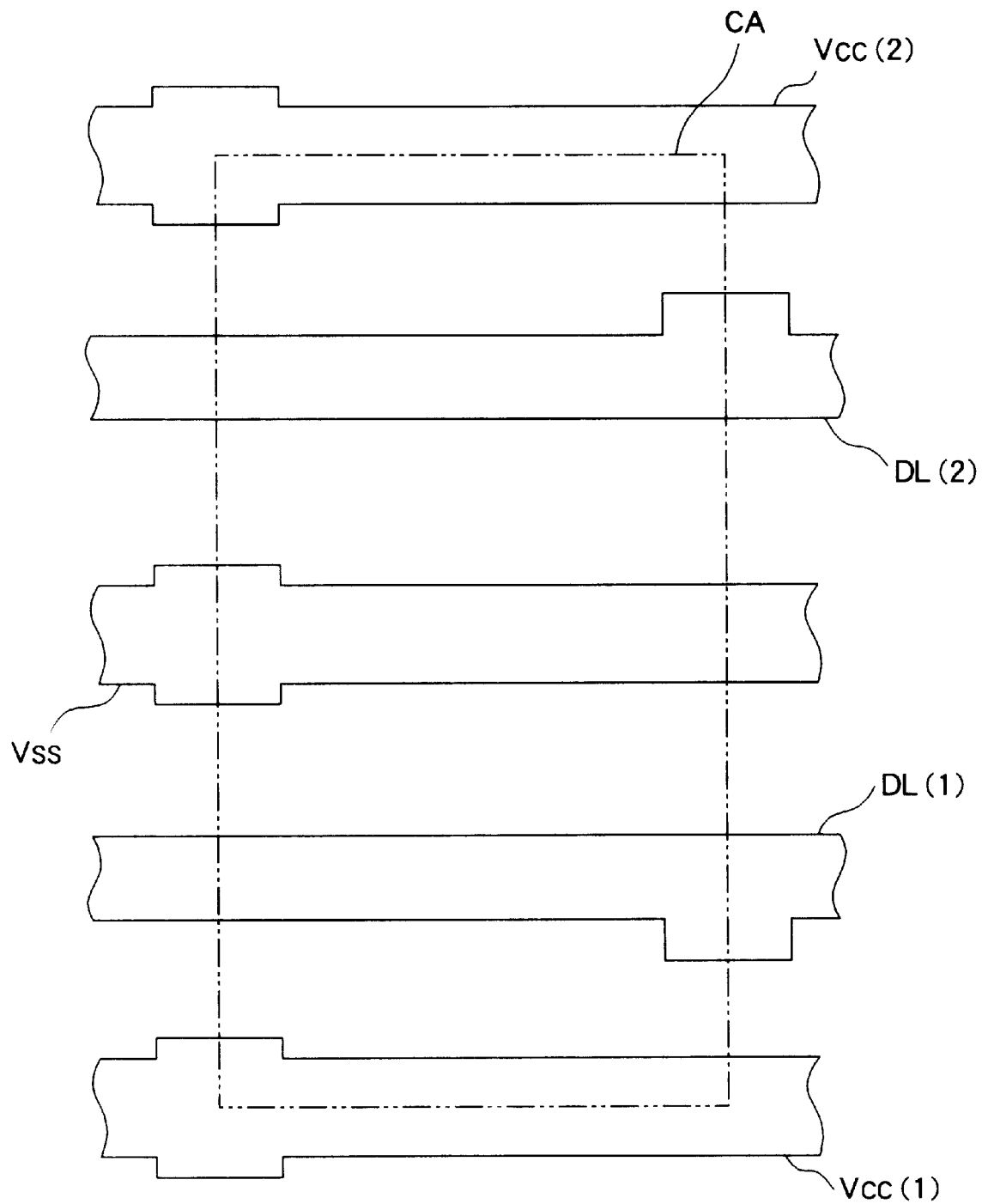

On the second insulator layer 95, a plurality of aluminium wirings were formed to a thickness between 5000 and 8000 angstroms as depicted in FIGS. 4 and 5 and 11 to serve as a first power bus Vcc(1), the first data line DL(1), the reference bus Vss, the second data line DL(2) and a second power bus Vcc(2). These aluminium wirings are commonly used by memory cells which are leftwardly or rightwardly next contiguous to the memory cell being illustrated. In this manner, a full CMOS SRAM comprises according to this invention a plurality of row-wise successively arranged memory cells along a data line pair (DL(1), DL(2)). In neighboring two of the row-wise arranged memory cells, other cell elements including the word line WL are in mirror images in connection with the left or the right side of the cell area, such as CA.

The first power bus Vcc(1) is commonly used by a memory cell bottomwise contiguous to the illustrated memory cell. The second power bus Vcc(2) is jointly used by another memory cell topwise contiguous to the illustrated memory cell. In this manner, each memory cell comprises a power bus Vcc. The full CMOS SRAM comprises a plurality of columnwise sequentially arranged memory cells which comprise the word line WL embedded therein and two adjacent ones of which comprise other cell elements in mirror images as regards the top or the bottom side of the cell areas, such as CA.

It is now understood in FIGS. 1 and 4 and 5 that the memory cell comprises the first and the second driver transistors QD and the first and the second load transistors QL along the word line WL. Only two transistors are, however, arranged along the data line pair DL, such as the first driver and transfer transistors QD(1) and QT(1), the second driver and transfer transistors QD(2) and QT(2), the first load and transfer transistors QL(1) and QT(1), or the second load and transfer transistors QL(2) and QT(2).

Consequently, it is possible to make each of the complementary data lines DL have a short length. For example, each cell area has in FIGS. 2, 3, and 4 a width ratio of 1.14, 0.65, and only 0.54 between a cell length parallel to the word line WL and a cell width parallel to the data line pair DL. This reduces the parasitic capacitance of the CMOS SRAM.

In addition, the power and the reference buses Vcc and Vss are arranged on both sides of each of the complementary data lines DL. Therefore, none of the data lines are extended close to each other. This reduces capacitive coupling between the complementary data lines DL(1) and DL(2) and between one of the complementary data lines of one pair and any one of the complementary data lines of another pair and insures stable cell operation of the CMOS SRAM which may be manufactured on a fine design rule and put in operation at a low voltage.

Referring afresh to FIG. 12 and again to FIG. 1, attention will be directed to a full CMOS SRAM cell according to a second preferred embodiment of this invention. Similar parts are designated again by like reference symbols and numerals. In the manner described in the foregoing, mirror image memory cells are present as leftwardly, rightwardly, bottomwise, and topwise contiguous cells contiguous to the left, the right, the bottom, and the top sides of a cell area CA of the memory cell being illustrated.

Centrally between the bottom and the top sides, a single n-activated region has here a channel shaped area having a thick vertical leg centrally between the left and the right sides and a pair of horizontal legs which extend into the rightwardly contiguous cell. The n-activated region is used to provide the first and the second transfer transistors QT and the first and the second driver transistors QD. First and second p-activated regions have an upright and an inverted Γ-shaped area having vertical legs extended into the bottomwise and the topwise contiguous cells. The first and the second p-activated regions are used in providing the first and the second load transistors QL.

As before, the word line WL serves as the gate electrodes of the first and the second transfer transistors QT. Different from FIGS. 4 and 7, the gate electrodes of the first driver and load transistors QD(1) and QL(1) are individually formed as first and second primary gate electrode regions 57(1) and 59(1) having their principal legs perpendicular to the word line WL. Unlike FIGS. 4 and 7, the gate electrodes of the second driver and load transistors QD(2) and QL(2) are separately provided by first and second secondary gate electrode regions 57(2) and 59(2).

Again as before, the first and the second primary contact holes 21 and 23 are formed through the first insulator layer 87 (FIG. 5) to reach a common area of one end of the source drain region of the first transfer transistor QT(1) and the drain region of the driver transistor QD(1) and to reach the drain region of the first load transistor QL(1), respectively. In a manner which is similar to FIGS. 4 and 6, eleventh primary and secondary contact holes 61(1) and 61(2) are formed through the first insulator layer 87 to reach an upwardly and rightwardly directed extension of the gate electrodes of the second driver transistor QD(2) and a short downwardly directed extension of the second load transistor QL(2), respectively. These four contact holes 21, 23, 61(1), and 61(2) are for the first intracell connection which is not numbered in FIG. 4 but is indicated at 91(1) in FIG. 9 although their outlines are considerably different from each other.

Similarly, the third and the fourth primary contact holes 25 and 27 are formed to reach a common area of one end of the source and drain region of the second transfer transistor QT(2) and the drain region of the second driver transistor QD(2) and to reach the drain region of the second load transistor QL(2), respectively. Twelfth primary and secondary contact holes 63(1) and 63(2) are formed to reach a downwardly and rightwardly directed extension of the gate electrode of the first driver transistor QD(1) and a slightly upwardly directed extension of the first load transistor QL(1), respectively. These contact holes are for the second intracell connection 91(2) (FIG. 9).

In other respects, the illustrated memory cell is substantially identical with the memory cell illustrated with reference to FIGS. 1 and 4 through 11. It should be noted in connection with the example being illustrated that four gate electrodes of the first and the second n-channel drive MOSFETs QD and of the first and the second p-channel load MOSFETs QL are separate from one another. It is therefore possible to form the first primary and secondary gate electrode regions 57(1) and 57(2) by two separate polycide films 83 (FIG. 5) doped with an n-type impurity and the second primary and secondary gate electrode regions 59(1) and 59(2) by two individual polycide films 83 doped with a p-type impurity. This enables to use p-type gates in the p-channel load MOSFETs QL as surface-channel ones and to resort to a finer design rule and to raise the performance of the CMOS SRAM.

The separate gate electrode regions 57(1), 57(2), 59(1), and 59(2) are therefore in marked contrast to the example described with reference to FIGS. 1 and 4 through 11, where only two first and second gate electrode regions 55 and 57 (see FIG. 7) are used in common by the first n-channel driver and p-channel load MOSFETs QD(1) and QL(1) and by the second n-channel driver and p-channel load MOSFETs QD(2) and QL(2) and consequently where use of the n-type or the p-type polycide film 87 as the first and the second gate electrode regions 55 and 57 would give rise to an undesirable variation in threshold voltages of these transistors QD and QL as a result of diffusion of the impurities into the gate electrode regions 55 and 57.

Figure 12:
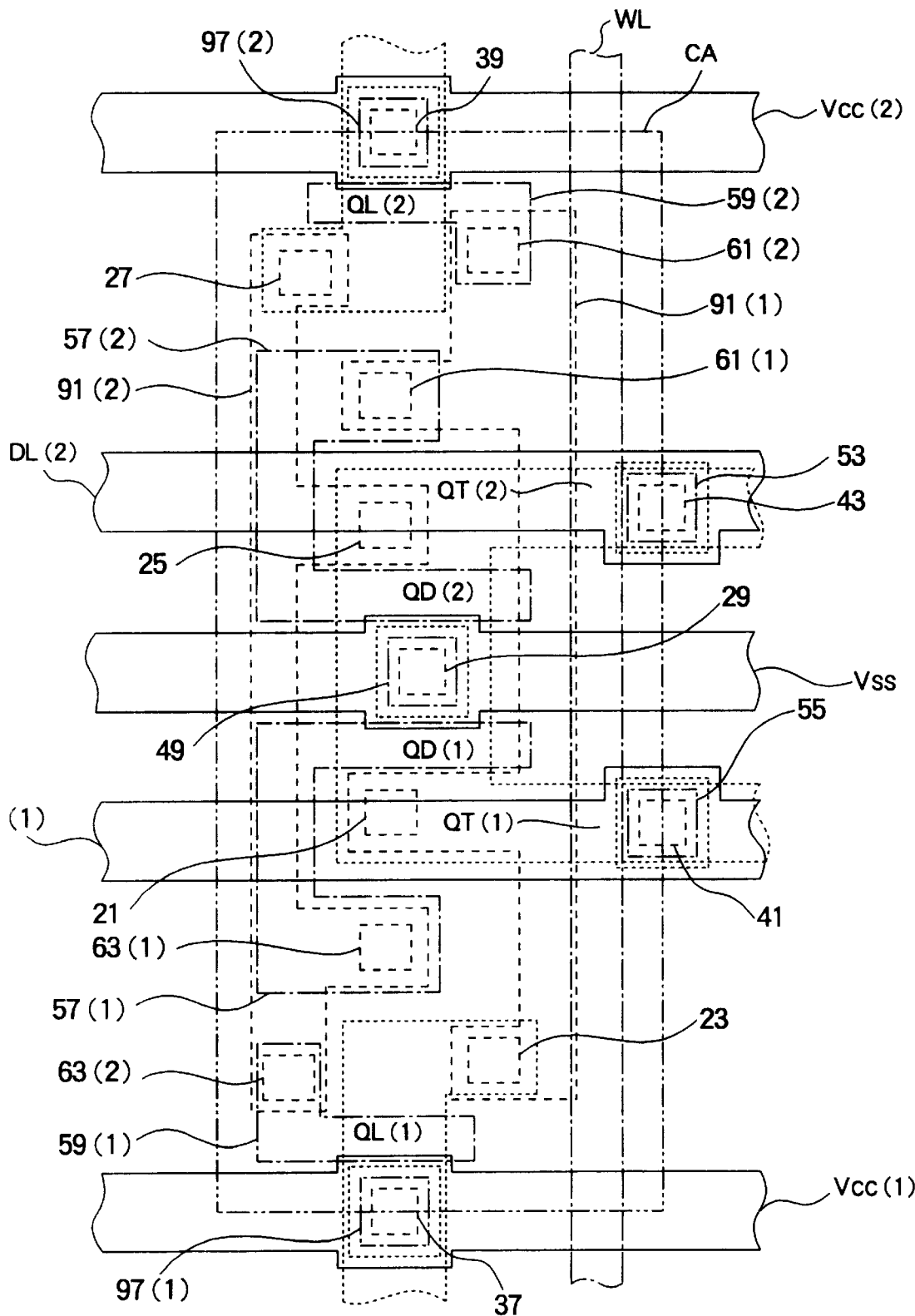
FIG. 12 is a schematic top view of a layout pattern of a full CMOS SRAM cell according to a second embodiment of this invention.

In the manner thus far been described, only the first transfer transistor QT(1) and the first driver or load transistor QD(1) or QL(1) or only the second transfer transistor QT(2) and either of the second driver and load transistors QD(2) and QL(2) are arranged along the complementary data line pair DL both in FIGS. 4 and 12. Each complementary data line therefore has a short length and an accordingly reduced parasitic capacitance.

Moreover, the power bus Vcc and the reference bus Vss are arranged on both sides of each of the complementary data lines DL parallel on a single level, namely, on an exposed surface of the CMOS SRAM. This avoids an objectionable parallel and close arrangement of the data lines DL in row-wise successively arranged memory cells and of each of the data lines DL and any one of the data lines of a corresponding pair in a columnwise contiguous memory cell and an undesired capacitive coupling even in the CMOS SRAM of a fine design rule and operable at a low voltage.

While this invention has thus far been described in specific conjunction with only two preferred embodiments thereof, it will now be readily possible for one skilled in the art to put this invention into practice in various other manners. For example, use of the tungsten plugs in the first primary contact hole 21 and other primary contact holes and in the first secondary contact hole 49 and similar secondary holes is not mandatory. Each of the left, the right, the bottom, and the top sides of the cell area CA need not be straight linear. The word line may not necessarily lie on the gate electrode level. It is possible to use other pads, one for connecting one of the first or the second power buses to the drain region of the first or the second load transistor through the primary and the secondary first or second contact holes and another for connecting the reference bus to the drain regions of the first and the second driver transistors. Incidentally, it should be noted that the rightwardly contiguous cell is equivalent depending on the circumstances to the leftwardly contiguous cell.

What is claimed is:

1. A complementary metal-oxide-semiconductor static random access memory cell comprising:

first and second driver transistors, first and second load transistors, first and second transfer transistors, a word line connected to gates of said first and said second transfer transistors, and first and second data lines disposed crosswise relative to said word line and connected to said first and said second transfer transistors, respectively, wherein said first and said second driver transistors and said first and said second load transistors are arranged to define four different rows and a single column, such that the gates of said first and second driver transistors and the gates of said first and second load transistors are arranged to intersect a same imaginary straight line that is parallel to said word line.

2. A memory cell as claimed in claim 1, further comprising a power bus and a reference bus parallel to said first and said second data lines on a same level, the reference bus being disposed between the data lines.

3. A memory cell as claimed in claim 2, further comprising a diffusion region level, a gate electrode level, a first insulator level, a first conductor level, a second insulator level, and a second conductor level successively stacked on a semiconductor substrate, wherein said word line lies on said gate electrode level and serves as gate electrodes of said first and said second transfer transistors, and said power bus, said reference bus, and said first and second data lines lie crosswise relative to said word line on said second conductor level.

4. A memory cell as claimed in claim 3 wherein a cell area, which is bounded on a left side by a leftwardly contiguous cell, on a right side by a rightwardly contiguous cell, on a bottom side by a bottomwise contiguous cell, and on a top side by a topwise contiguous cell, is defined, and wherein each of said leftwardly and said rightwardly contiguous cells and each of said bottomwise and said topwise contiguous cells are in a mirror image relation to said cell area.

5. A memory cell as claimed in claim 1, wherein no more than two of said first and second driver, load, and transfer transistors are arranged to intersect any imaginary straight line that is parallel to said first and said second data lines.

6. A memory cell as claimed in claim 5, wherein said first transfer transistor and said first driver transistor are arranged to intersect a straight line that is parallel to said first and said second data lines and said second transfer transistor and said second driver transistor are arranged to intersect a straight line that is parallel to said first and said second data lines.

7. A memory cell comprising:
a word line;
first and second complementary data lines disposed crosswise relative to the word line but on a level that is above the word line;
a reference bus parallel to and between the data lines on the same level as the data lines;
a pair of power buses parallel to and positioned outside of the data lines on the same level as the data lines; and
first and second driver transistors, each driver transistor having a gate, a source region, and a drain region, the source regions of the first and second driver transistors being connected to the reference bus, the drain regions of the first and second driver transistors defining a first node and a second node respectively, the gate of the first driver transistor being connected to the second node and the gate of the second driver transistor being connected to the first node;
first and second load transistors, each load transistor having a gate, a source region, and a drain region, the source regions of the first and second load transistors being connected respectively to the power buses, the drain regions of the first and second load transistors being connected to the drain regions of the first and second driver transistors respectively, the gate of the first load transistor being connected to the second node and the gate of the second load transistor being connected to the first node; and
first and second transfer transistors, each transfer transistor having a gate, a source region, and a drain region, the source regions of the first and second transfer transistors being connected respectively to the first and second data lines, the drain regions of the first and second transfer transistors being connected to the drain regions of the first and second driver transistors respectively, the gates of the first and second transfer transistors being connected to the word line,
wherein the gates of the first and second driver transistors and the gates of the first and second load transistors are arranged to define four different rows and a single column and to intersect a same imaginary straight line that is parallel to the word line and the gates of the first and second transfer transistors are arranged to be parallel to the word line.

8. A memory cell as claimed in claim 7, further comprising a plurality of levels successively stacked on a semiconductor substrate, wherein the level of the power buses, the reference bus, and the data lines lie define a first level and the level of the word line defines a second level that is different from and below the first level.

9. A memory cell as claimed in claim 8, wherein the source and drain regions of the driver, load, and transfer transistors lie on a diffusion region level, and the gates of the driver, load, and transfer transistors lie on the second level which is above the diffusion region level.

10. A memory cell as claimed in claim 9, wherein the first and second levels are separated by an intracell connection level, and the intracell connection level is separated from the first and second levels by a first insulator level and a second insulator level, respectively.

11. A complementary metal-oxide-semiconductor (CMOS) static random access memory (SRAM), comprising:
a plurality of pairs of power buses;
a plurality of reference buses;
a plurality of pairs of data lines;
a plurality of word lines; and
a plurality of cells arranged in a matrix fashion, a column of cells sharing a common word line, a row of cells sharing a common pair of power buses, a common pair of data lines, and a common reference bus, and vertically adjacent cells sharing a common power bus,
wherein each cell has a reference bus, a pair of data lines, and a pair of power buses, the reference bus being parallel to and between the pair of data lines and the pair of power buses and the pair of data lines being parallel to and between the pair of power buses, wherein each cell comprises:
first and second driver transistors;
first and second load transistors; and
first and second transfer transistors,
wherein each transistor has a gate, a source region, and a drain region, the source regions of the first and second driver transistors being connected to the reference bus, the source regions of the first and second load transistors being connected respectively to the power buses, the source regions of the first and second transfer transistors being connected respectively to two data lines, the drain regions of the first driver transistor, the first load transistor, and the first transfer transistor being connected together through a first node to control the gates of the second driver transistor and the second load transistor, the drain regions of the second driver transistor, the second load transistor, and the second transfer transistor being connected together through a second node to control the gates of the first driver transistor and the first load transistor, and
wherein the gates of the first and second driver transisitors and the gates of the first and second load transistors are arranged to define four different rows and a single column and to intersect a same imaginary straight line that is parallel to the word line and the gates of the first and second transfer transistors are parallel to and connected to the word line.

12. A CMOS SRAM as claimed in claim 11, further comprising a plurality of levels successively stacked on a semiconductor substrate, and wherein the plurality of pairs of power buses, reference buses, and pairs of data lines lie on a first level and the plurality of word lines lie on a second level that is different from the first level.

13. A CMOS SRAM as claimed in claim 12, wherein the second level is below the first level.

14. A CMOS SRAM as claimed in claim 13, wherein the source and drain regions of the transistors lie on a diffusion region level, and the gates of the transistors lie on the second level which is above the diffusion region level.

15. A CMOS SRAM as claimed in claim 14, wherein the first and second levels are separated by an intracell connection level, and the intracell connection level is separated from the first and second levels by a first insulator level and a second insulator level, respectively.

16. A CMOS SRAM as claimed in claim 15, wherein adjacent cells share common source regions for the driver, load, and transfer transistors.

17. A CMOS SRAM as claimed in claim 16, wherein each cell further comprises first and second intracell connectors which lie on the intracell connection level, wherein the drain regions of the first driver transistor, the first load transistor, and the first transfer transistor are connected together through the first intracell connector and the drain regions of the second driver transistor, the second load transistor, and the second transfer transistor are connected together through the second intracell connector.

18. A CMOS SRAM as claimed in claim 17, further comprising first and second insulator layers, the first insulator layer lying on the first insulation level to separate the first level from the intracell connection level and the second insulator layer lying on the second insulation level to separate the second level from the intracell connection level.

19. A CMOS SRAM as claimed in claim 18, wherein a plurality of contact holes are formed in the first and second insulator layers and formed with conductive plugs to connect between the different levels.

* * * * *